(12) United States Patent
Clingman et al.

(10) Patent No.: US 7,459,837 B2
(45) Date of Patent: Dec. 2, 2008

(54) BROADBAND ENERGY HARVESTER APPARATUS AND METHOD

(75) Inventors: Dan J. Clingman, Auburn, WA (US); Jack Theisen, Easley, SC (US)

(73) Assignee: The Boeing Company, Chicago, IL (US)

( * ) Notice: Subject to any disclaimer, the term of this patent is extended or adjusted under 35 U.S.C. 154(b) by 29 days.

(21) Appl. No.: 11/613,902

(22) Filed: Dec. 20, 2006

(65) Prior Publication Data

US 2008/0150395 A1    Jun. 26, 2008

(51) Int. Cl.
*H01L 41/113* (2006.01)
(52) U.S. Cl. ...................................... 310/339
(58) Field of Classification Search .................. 310/339
See application file for complete search history.

(56) References Cited

U.S. PATENT DOCUMENTS

| | | | | |
|---|---|---|---|---|
| 2,539,535 A | * | 1/1951 | Espenschied | 290/1 R |
| 3,350,583 A | * | 10/1967 | Schiavone | 310/319 |
| 5,512,795 A | * | 4/1996 | Epstein et al. | 310/339 |
| 5,814,921 A | * | 9/1998 | Carroll | 310/339 |
| 6,060,817 A | * | 5/2000 | Mullen et al. | 310/339 |
| 6,376,968 B1 | * | 4/2002 | Taylor et al. | 310/339 |
| 6,655,035 B2 | * | 12/2003 | Ghandi et al. | 310/339 |
| 7,081,699 B2 | | 7/2006 | Keolian et al. | |
| 2005/0225207 A1 | * | 10/2005 | Tsujiura | 310/328 |
| 2005/0269907 A1 | * | 12/2005 | Erickson | 310/339 |

* cited by examiner

*Primary Examiner*—Thomas M Dougherty
(74) *Attorney, Agent, or Firm*—Harness, Dickey & Pierce, P.L.C.

(57) ABSTRACT

An energy harvesting apparatus and method for harvesting vibration energy over a wide frequency band and at low amplitudes. The apparatus includes a reaction component that is supported by a plurality of independent piezoelectric flexures from a base. The flexures are secured to the base and to portions of the reaction component so that they create equal but opposite constant moments applied to the reaction component that cancel one another out. As the base experiences lateral vibration energy, this causes a swinging or rolling motion of the reaction component, that causes changes in stress and/or strain experienced by the flexures. This causes the flexures to generate electrical signals that can be used powering external devices.

20 Claims, 5 Drawing Sheets

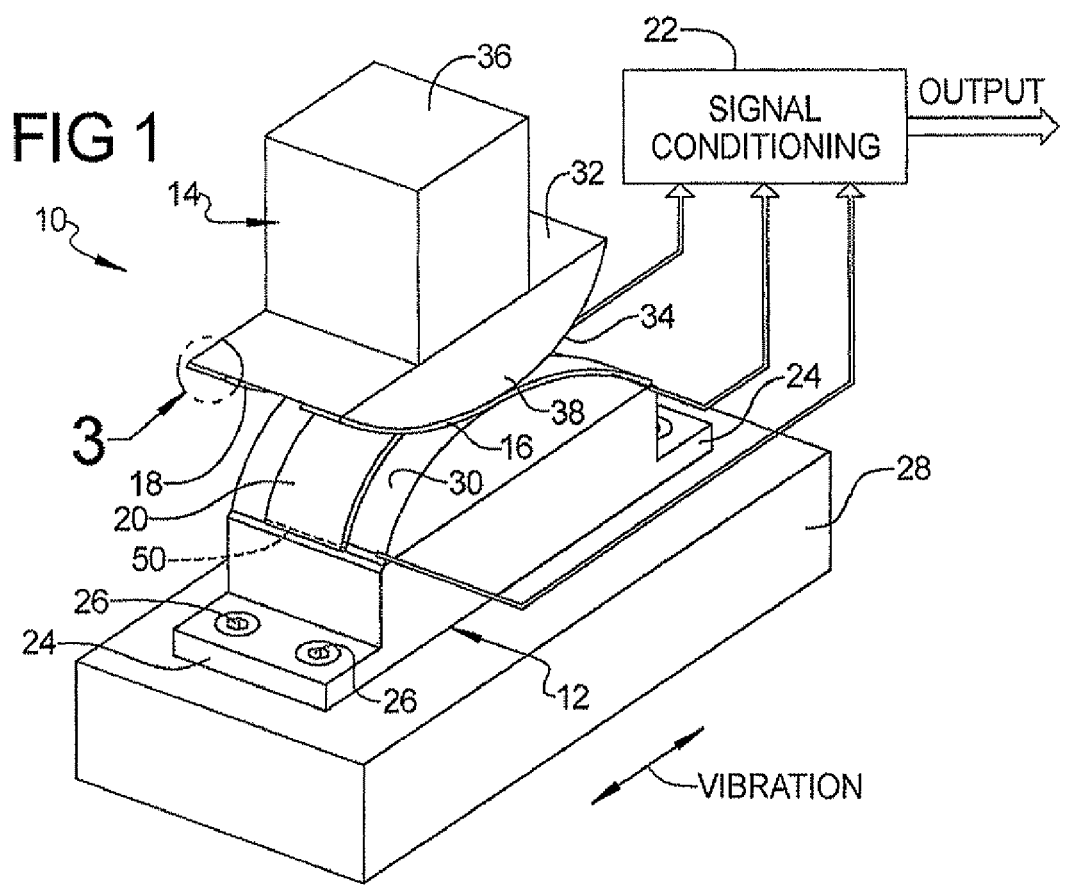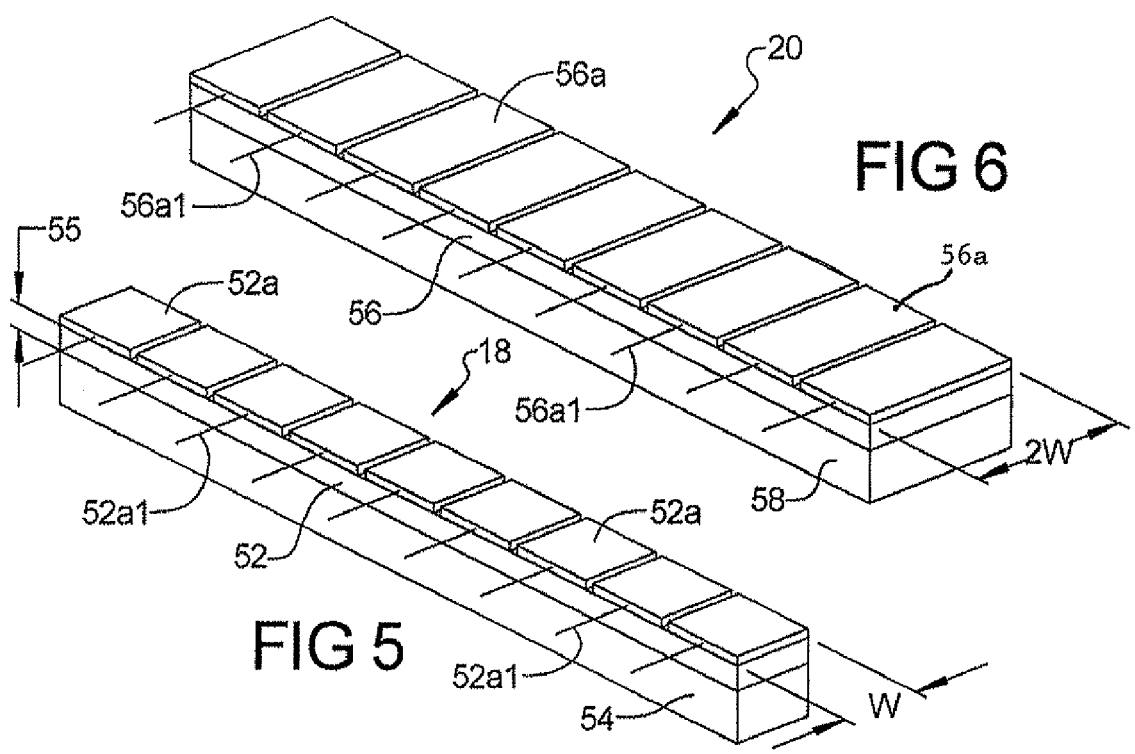

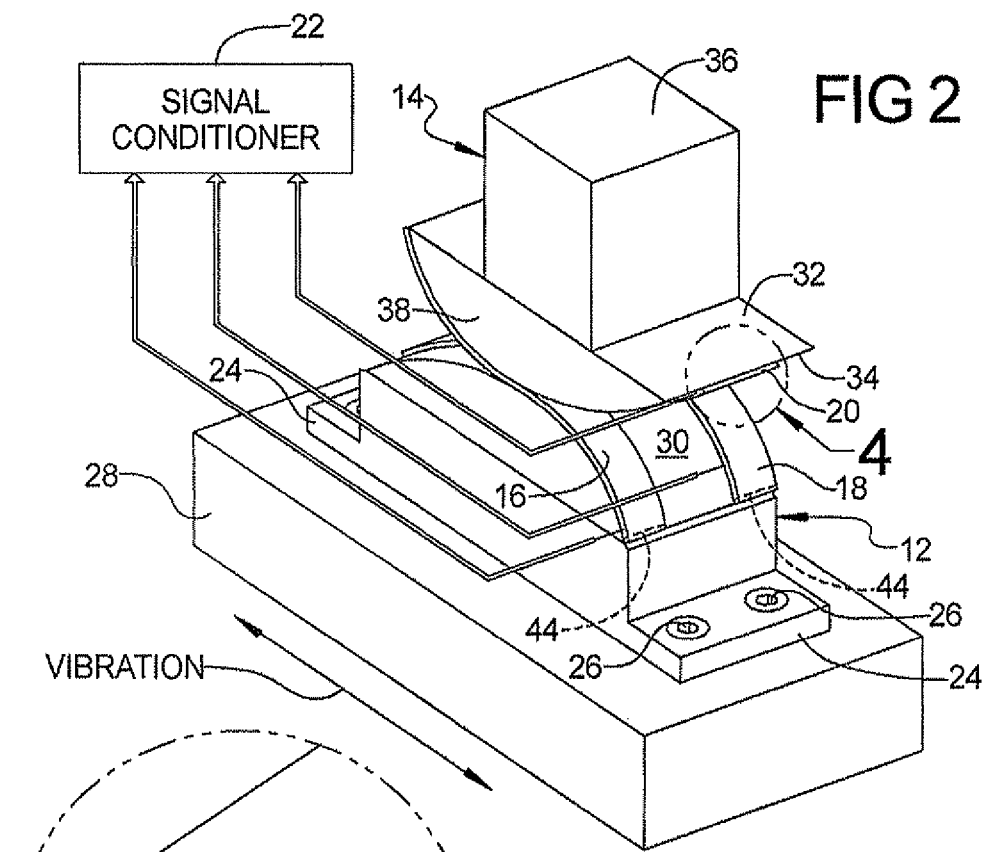
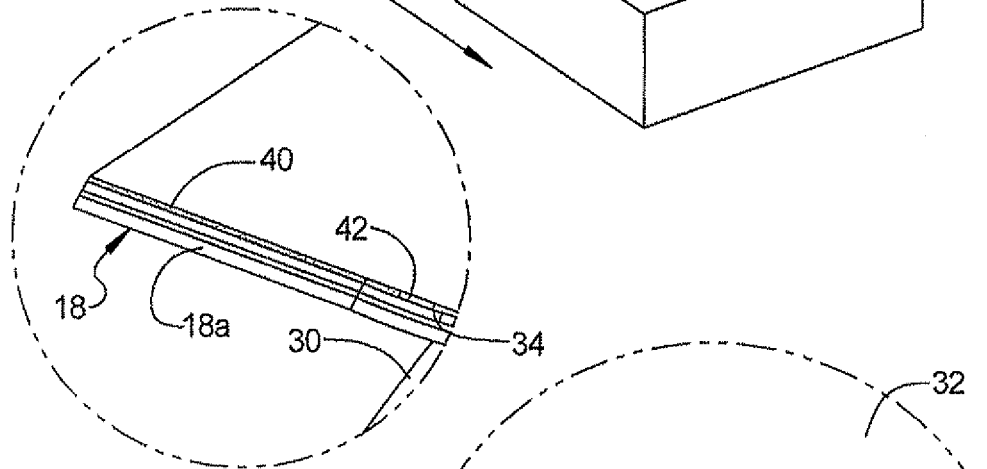
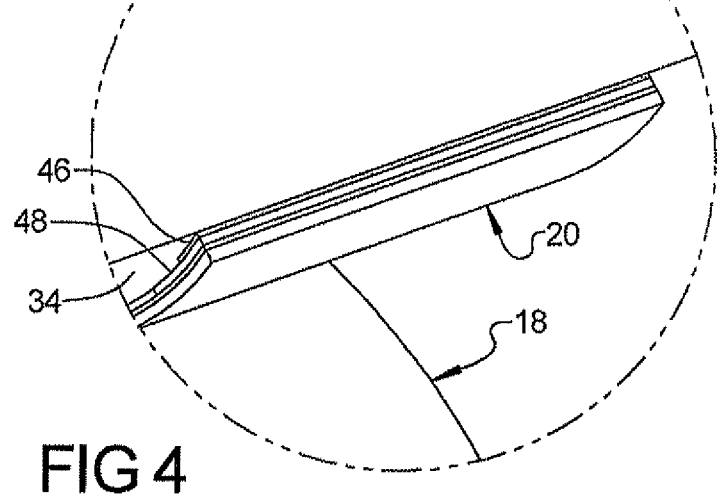

BROADBAND ENERGY HARVESTER APPARATUS AND METHOD

CROSS REFERENCE TO RELATED APPLICATIONS

The present application is related in general subject matter to U.S. patent application Ser. No. 11/613,893, filed Dec. 20, 2006, which is also hereby incorporated by reference into the present application.

FIELD

The present disclosure relates to energy harvesting devices and methods, and more particularly to a broadband energy harvesting apparatus and method that is able to generate electric signals in response to vibration experienced by a component from which the apparatus is supported.

BACKGROUND

Vibration energy is experience by many types of apparatuses and systems, and particularly with mobile platforms such as aircraft, land based vehicles, marine vehicles, rotorcraft, etc. Various attempts have been made to harvest such vibration energy to generate electric signals that can be used for various purposes, for example for powering actuators, sensors, or various other electronic devices.

Present day energy harvesting devices and methods, however, are not particularly sensitive to vibration energy over a broad frequency range. Often, present day energy harvesting devices must be designed with a specific operating frequency, or a specific, relatively narrow frequency operating range in mind, to provide acceptable energy harvesting results. Additionally, many present day energy harvesting devices are not especially sensitive to low amplitude vibration signals.

Accordingly, there still exists a need for an energy harvesting device and method which is responsive to vibration energy over a wide frequency band and at low amplitudes. There further exists a need for an energy harvesting apparatus and method that can be implemented with a relatively small number of independent component parts.

SUMMARY

The present disclosure relates to an energy harvesting apparatus and method that is well suited for use over a broad frequency band of vibration energy, and is further highly responsive to low amplitude vibration energy. In one implementation a base component is secured to a structure experiencing vibration. A reaction component is supported adjacent to the base by at least one flexure. The flexure is secured at a first portion to a portion of the base, and at a second portion to the reaction component. The flexure is capable of generating electrical signals in response to flexing movement thereof caused by motion of the reaction component.

In operation, as the structure experiencing vibration vibrates, the vibration is transmitted to the base. As the base vibrates, this causes a lateral motion of the reaction component, which in turn causes flexing of the flexure. The flexing causes the flexure to experience stress and/or strain. The stress and/or strain experienced by the flexure causes the flexure to generate electrical signals. The electrical signals can be used for a wide variety of purposes, for example, for powering sensors, actuators or other electronic devices or instruments.

In one implementation the flexure includes a piezoelectric material that is supported on a flexible support substrate. The piezoelectric material responds to stress and/or strain by generating electrical signals.

In one specific implementation a portion of the base has a curved surface, and a portion of the reaction component also has a curved shape. As the reaction component experiences vibration it moves in a rolling motion about an arc defined by the curvature of the curved surface of the base component.

In still another implementation, a plurality of flexures support the reaction component from the base. In one implementation the reaction component is supported so as to be spaced apart from the base portion. In still another implementation the reaction component is supported so that it is suspended from the base. The reaction component resists movement as the base experiences vibration energy, which causes stress and/or strain to be experienced by the flexures, which in turn causes the flexures to generate electrical signals.

In still another implementation, at least one flexure is used that is comprised of a support substrate having a plurality of electrically independent electrodes formed on a continuous length of a piezoelectric material layer. The use of a plurality of electrically independent electrodes on the piezoelectric material layer eliminates the parasitic capacitance that can be induced in those areas of the flexure that are not undergoing stress and/or strain as the reaction mass is moving in response to vibration. This significantly improves the efficiency of the electrical output of the flexure.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 1 is a perspective view of one embodiment of an energy harvesting apparatus in accordance with the present disclosure;

FIG. 2 is a view of the apparatus of FIG. 1 in accordance with directional arrow 2 in FIG. 1;

FIG. 3 is an enlarged view of circled portion 3 in FIG. 1 illustrating the attachment of one end of one of the flexures to a reaction component of the apparatus;

FIG. 4 is an enlarged view of circled portion 4 in FIG. 2;

FIG. 5 is a perspective view of one of the two outer flexures shown in FIG. 1 prior to being assembled to the base and reaction component in FIG. 1;

FIG. 6 is a view of the center flexure shown in FIG. 1 prior to being assembled to form the apparatus of FIG. 1;

DETAILED DESCRIPTION

Figure 7:
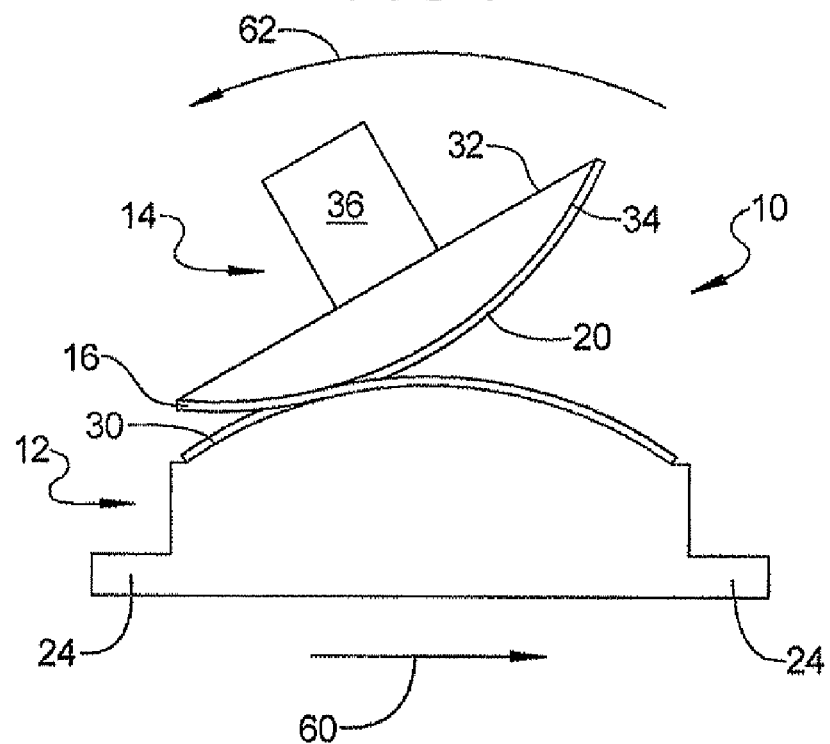
FIG. 7 is an illustration of the motion of the reaction component in response to movement of the base in a first direction, and the resulting flexing of the flexures supporting the reaction component from the base.

The following description is merely exemplary in nature and is not intended to limit the present disclosure, application, or uses.

Referring to FIGS. 1 and 2, there is shown an energy harvesting apparatus 10 in accordance with an embodiment of the present disclosure. In this embodiment, the apparatus 10 generally includes a base 12, a reaction component 14 and three flexure components 16, 18 and 20. The flexure components 16, 18 and 20 are used to support the reaction component closely adjacent to the base component while allowing a rolling motion of the reaction component 14 about the base 12. The flexures 16, 18 and 20 are able to generate electrical signals in response to stress and/or strain that they experience during flexing motion as the reaction component 14 rolls about the base 12. The electrical signals are fed to a signal conditioning circuit 22 and thereafter may be used to power various forms of electronic devices such as actuators, sensors, etc.

Referring further to FIGS. 1 and 2, the base 12 includes a pair of flanges 24 which may be used to receive conventional threaded fastening elements 26 through threaded openings (not shown) to allow the base 12 to be secured to a vibrating structure 28. The vibrating structure 28 may form a portion of the mobile platform, for example, an aircraft, rotorcraft, an automotive vehicle, a train, marine vessel or any other form of vehicle or structure that experiences vibration energy that would be desirable to harvest. The base 12 includes a curved upper surface 30 forming an arc. The reaction component 14 is supported by the flexures 16, 18 and 20 so that lateral vibration energy experienced by the base 12 causes a rolling or rocking motion of the reaction component 14 about an arc defined by the curved upper surface 30. The base 12 may be made from aluminum, steel, plastic, composites, or any other suitably strong material.

The reaction component 14 includes a semi-circular portion 32 having a curved surface 34, and a block 36 acting as a mass that is secured to the semi-circular portion 32. The block 36 may be made from aluminum or steel or any other component that adds tangible mass to the reaction component 14. Alternatively, the reaction component 14 may be formed as a single piece component from a single piece of material. If manufactured as a single piece component, then the reaction component 14 may be manufactured from aluminum or steel, or any other suitable material that enables a tangible amount of mass to be added by the block 36 portion of the overall reaction component 14.

The mass of the block 36 functions to move the center of gravity away from the fulcrum area 38 of the semi-circular portion 32, thus significantly increasing the moment produced by the reaction component 14 as a lateral vibration force is experienced. This significantly increases the tendency of the reaction component 14 to roll back and forth on the base 12 in response to an oscillating, lateral vibration force experienced by the base 12. In one implementation, the radius of curvature of the curved surface 34 is approximately 0.375 inch (9.525 mm), and the width of the semi-circular portion 32 is approximately 1.25 inch (31.75 mm). In this implementation, the radius of curvature of the curved surface 30 of the base 12 is also about 0.375 inch (9.525 mm). It will be appreciated that these dimensions may vary significantly depending on the vibrating structure to which the apparatus 10 is secured, the magnitude of lateral vibration energy that is being harvested, and even the materials used for the base 12 and the reaction component 14.

Referring to FIGS. 3 and 4, the attachment of the flexure 18 (FIG. 3) and the flexure 20 (FIG. 4) to the base 12 is illustrated. Referring initially to FIG. 3, a bead of adhesive 40 is used to secure an inside surface 42 of flexure 18 to the curved surface 34 of the reaction component 14. As noted from the drawing figure, the adhesive 40 may be placed adjacent one outermost end 18a of the flexure 18, rather than continuously along its inside surface 42. The adhesive may comprise epoxy or any other suitable adhesive that provides a secure bond. The opposite end of flexure 18 is similarly secured by a bead of epoxy or suitable adhesive, as indicated by dashed line 44 in FIG. 2. Thus, the flexure 18 may be secured only at its outermost end portions to the reaction component 14 and to the base 12 allowing maximum roller travel. The flexure 16 is secured to the reaction component 14 and to the base 12 in the same fashion as described above for flexure 18.

Referring to FIG. 4, the flexure 20 is similarly secured by a bead of adhesive 46, possibly comprising epoxy or any other suitable strong adhesive, at one outermost end 20a thereof. The bead of adhesive 46 is placed along an inner surface 48 of the flexure 20 along its outermost end 20a. The opposite end of the flexure 20 is secured by a similar bead of adhesive as indicated by dashed line 50 in FIG. 1. Thus, the flexure 20 may also be secured only at its outermost end portions to the reaction component 14 and to the base 12.

Referring to FIGS. 5 and 6, the construction of flexures 18 and 20, respectively, can be seen in greater detail. In this example the construction of flexure 18 is identical to that of flexure 16, although the two flexures need not necessarily be constructed in identical fashion. The flexures 16, 18 and 20 are all constructed so that they are flat prior to being installed. Once installed, each is held in a flexed orientation under tension. The biasing forces provided by flexures 16 and 18 counter balance the biasing force of flexure 20 so that the reaction component 14 is held in the neutral position shown in FIGS. 1 and 2. In this example the flexures 16, 18 and 20 each form unimorph piezoelectric flexures.

In FIG. 5, flexure 18, in one embodiment, includes a support substrate 54 on which is disposed an electrically responsive layer of piezoelectric material 52, which in this example may be a piezoceramic material layer. The piezoelectric material layer 52 includes a plurality of independent, electrically conductive electrode segments 52a formed one of its surfaces. The independent electrode segments 52a each have a conductive lead 52a1 extending therefrom. Electrode segments 52a may be formed during manufacture of the flexure 18 by first depositing a conductive material, for example copper, onto the piezoceramic material layer 52 and then etching a plurality of spaced apart parallel slots completely through the thickness of just the conductive layer. This results in the plurality of independent, electrically conductive electrode segments 52a that do not impact the overall thickness or flexibility of the flexure 18. Each electrode segment 52a is used to capture and transmit the electrical energy generated by the stress and/or strain experienced in the area of the piezoceramic material layer 52 immediately beneath it.

In this example the support substrate 54 has a width "W" and a thickness denoted by arrows 55. The width of the piezoelectric material layer 52 is approximately equal to the width (W) of the substrate 54, but does not necessarily need to be equal. The support substrate 54 may be formed from any material that is able to be flexed repeatedly without breaking or fracturing. For example, composite materials or spring steel may be used to form the support substrate 54. A uniaxial composite beam is especially well suited for use as the support substrate 54.

The piezoelectric material electrode segments 52a are also shown in FIG. 5 as all being of the same length, width and thickness, although this is merely meant to illustrate one example of a suitable configuration of electrode segments for use with the flexure 18. In practice, the independent electrode segments 52a may vary from one another in one or more dimensions of length and width to suit the needs of a specific application. In the exemplary configuration shown in FIG. 5, the length and width of each electrode segment 52a form a generally square shape. The overall thickness of the piezoelectric material layer 52 and the electrode segments 52a may vary significantly to suit the needs of a specific application, but in one example is between about 0.005-0.020 inch (0.127-0.508 mm).

The use of independent piezoelectric material electrode segments 52a provides the additional advantage of reducing parasitic capacitance for those segments that are not experiencing stress and/or strain during rolling motion of the reaction component 14. This increases the efficiency of each flexure 16 and 18 in generating electrical signals in response to small amplitude vibration energy. However, if high sensitivity to low amplitude vibration is not an important design criterion, of if the cost of manufacture is an especially important concern, then a single length of electrode material may be used in place of the plurality of independent electrode segments 52a on the piezoelectric material layer 52.

When the flexure 18 is flexed into the position shown in FIGS. 1 and 2, the piezoelectric material electrode segments 52 that are in contact with the curved surface 34 are mostly in compression. Thus, for example, if flexures 16 and 20 were not present in the apparatus 10 shown in FIG. 1, the reaction component 10 would roll to the left in the drawing of FIG. 1 (i.e., to straighten out as much as possible).

The flexure 20 of FIG. 6 is essentially identical in construction to the flexure 18 with the exception that its width "W" may be about twice the width (i.e., "2W") of the flexure 18 in FIG. 5. This is so that the flexure 20 can provide a biasing force that is approximately equal and opposite to the biasing force provided by the flexures 16 and 18, to thus maintain the reaction component 14 centered on the base 12 when no vibration energy is being experienced. The flexure 20 similarly includes an independent, electrically responsive material layer, which in this example comprises a piezoelectric material layer 56 that is secured to a flexible support substrate 58.

The support substrate 58 may also comprise a composite material, such as a uniaxial composite beam, or possibly a length of spring steel, or any other suitable material that is flexible and resistant to breaking or fracturing during repeated flexing. The dimensions of the piezoelectric material layer 56 may be similar to those given for layer 52, or they may differ from that of material layer 52. Independent electrode segments 56a are formed on the piezoelectric material layer 56 that each have a conductor 56a1 extending therefrom. Each of the piezoelectric electrode segments 56a enable the electrical signals generated by its associated area of the piezoelectric material layer 56 to be routed to the signal conditioning circuit 22. Adhesives such as HYSOL® 9330 or LOCTITE® 3411 epoxy may be used to secure the piezoelectric material layer 56 to the support substrate 58, as well as to secure the piezoelectric material layer 52 to the support substrate 54 (FIG. 5).

While the flexures 16, 18 and 20 have been described above as comprising piezoelectric material on one surface thereof (to thus form unimorph piezoelectric structures), it will be appreciated that other electrically responsive materials could just as readily be incorporated. For example, in lieu of piezoelectric material, magnetostrictive material could used. Virtually any other type of material that is able to generate electrical signals in response to changes in stress and/or strain that it experiences could potentially be implemented.

As noted in FIGS. 1 and 2, the flexure 20 is secured to the curved surface 34 of the reaction component 14 along the opposite side as those of flexures 16 and 18. For example, if flexures 16 and 18 were not present, the biasing force provided by flexure 20 would cause the reaction component 14 to roll to the right in FIG. 1. However, when all three flexures 16, 18 and 20 are secured to the reaction component 14, the biasing forces provided by flexures 16 and 18 work against the biasing provided by flexure 20, thus creating a "constant moment" for the reaction component 14. This arrangement also overcomes the inherent stiffness of the flexures 16, 18 and 20, which enables the reaction component 14 to be highly sensitive to even small degrees of lateral vibration energy experienced by the base 20.

Figure 8:
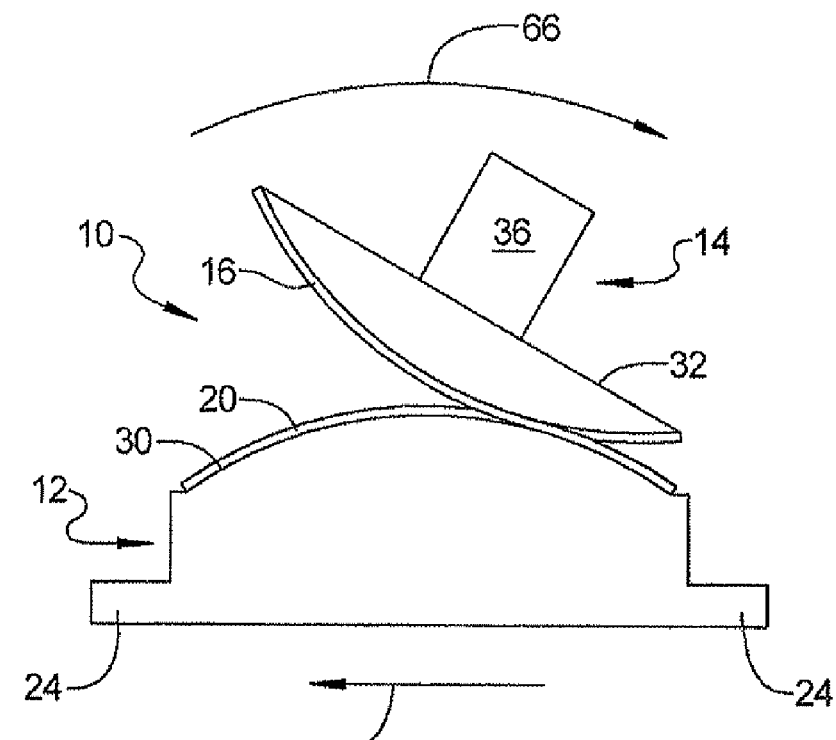
FIG. 8 illustrates the movement of the reaction component in response to base movement in the opposite direction of that shown in FIG. 7.

Referring to FIGS. 7 and 8, the operation of the apparatus 10 will be described in greater detail. In FIG. 7, when the base 12 experiences a lateral vibration force in accordance with directional arrow 60, a moment is created that causes the reaction component 14 to roll along the path defined by the curved upper surface 30 of the base 12, in accordance with arrow 62. This causes unflexing of the flexures 16 and 18 (i.e., de-compression), thus causing the piezoelectric material layer 52 disposed adjacent the curved surface 30 to experience a change in the stress and/or strain from that experienced when the reaction component 14 is at its neutral, resting position. This change in the stress and/or strain being experienced by the piezoelectric material layer 52 causes the piezoelectric electrode segments 52a to generate electrical signals. Similarly, the area of the flexure 20 adjacent the point of contact between the reaction component 14 and the base 12 experiences different levels of stress and/or strain as it becomes compressed, as the reaction component rolls to the left in FIG. 7. This causes the piezoelectric material layer 56 of the flexure 20 to experience changing levels of stress and/or strain. This results in the electrode segments 56a generating electrical signals simultaneously with those being generated by the flexures 16 and 18. All of these electrical signals are transmitted to the signal conditioning circuit 22 and subsequently output from the circuit 22 for use in powering and/or controlling other electrical components.

Referring to FIG. 8, as the lateral vibration force changes direction in accordance with arrow 64, the reaction component 14 is caused to roll to the right in accordance with arrow 66. This causes the piezoelectric material layers 52 of flexures 16 and 18 to flex into compression, thus experiencing changing levels of stress and/or strain and causing electrical signals to be generated by specific ones of the electrode segments 52a. Simultaneously, flexure 20 is urged into a more planar configuration, which causes its piezoelectric material layer 56 to de-compress, and thus to also experience a change in the level of stress and/or strain that it is experiencing. The changing levels of stress and/or strain result in electrical signals being generated by specific ones of the electrode segments 56a. Thus, during this rolling motion, all of the flexures 16, 18 and 20 generate electrical signals. Once the vibration energy stops, the biasing force provided by the flexures 16, 18 and 20 returns the reaction component 14 to the orientation (i.e., neutral position) shown in FIGS. 1 and 2. Thus, regardless of the lateral direction of the vibration force being experienced by the base 20, the flexing imparted to the flexures 16, 18 and 20 by the rolling motion of the reaction component 14 causes electrical signals to be generated by each flexure 16, 18, and 20. This is so regardless of the direction of rolling movement of the reaction component 14

Figure 9:
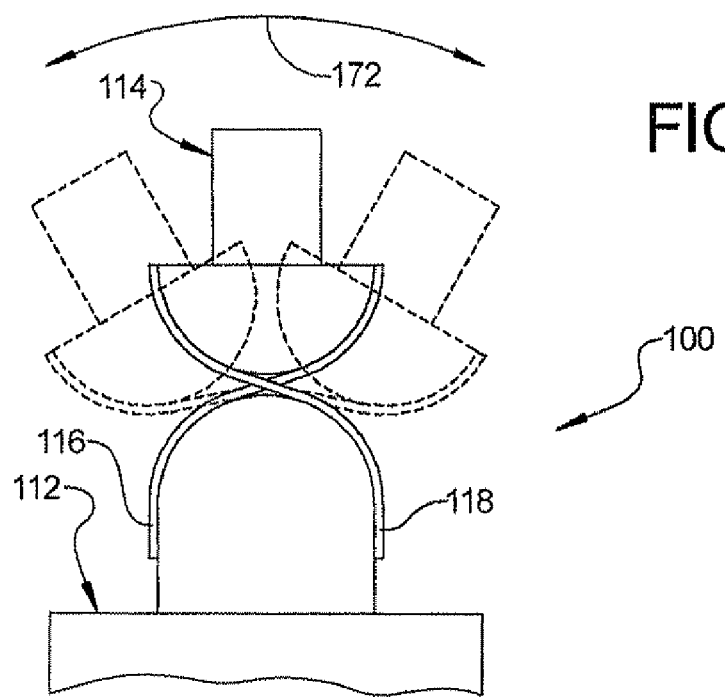
FIG. 9 is an illustration of an alternative embodiment of the apparatus in which the reaction component is supported in a spaced apart orientation from the base, and free to swing laterally about an arc in response to lateral vibrational movement of the base.

Referring now to FIG. 9, an apparatus 100 in accordance with another embodiment of the present disclosure is illustrated. Components in common with apparatus 10 are designated with reference numerals increased by 100 over those used in connection with the description of apparatus 10. The apparatus 100 includes a base 112 and a reaction component 114. A plurality of flexures 116 and 120 are used to support the reaction component 114 from the base. Flexures 116 and 118 are arranged with flexure 118 being positioned between a pair of flexures 116 (only one of flexures 116 being visible in the side view of FIG. 9) in a manner identical to that described for flexures 16, 18 and 20 of apparatus 10 (FIGS. 1 and 2). However, rather than the reaction component 114 rolling about the curved surface 30 of the base 12 illustrated in FIG. 1, the flexures 116 and 118 are used to support the reaction component 114 a distance above the base 112. Lateral vibrational movement in accordance with directional arrow 170 causes a swinging motion of the reaction component 114 in accordance with arc 172 in FIG. 9. The flexures 116 and 118 operate in the manner described for flexures 16, 18 and 20 to generate electrical signals, regardless of the direction in which the swinging component 114 is moving, as they each experience changing levels of stress and/or strain while flexing.

Figure 10:
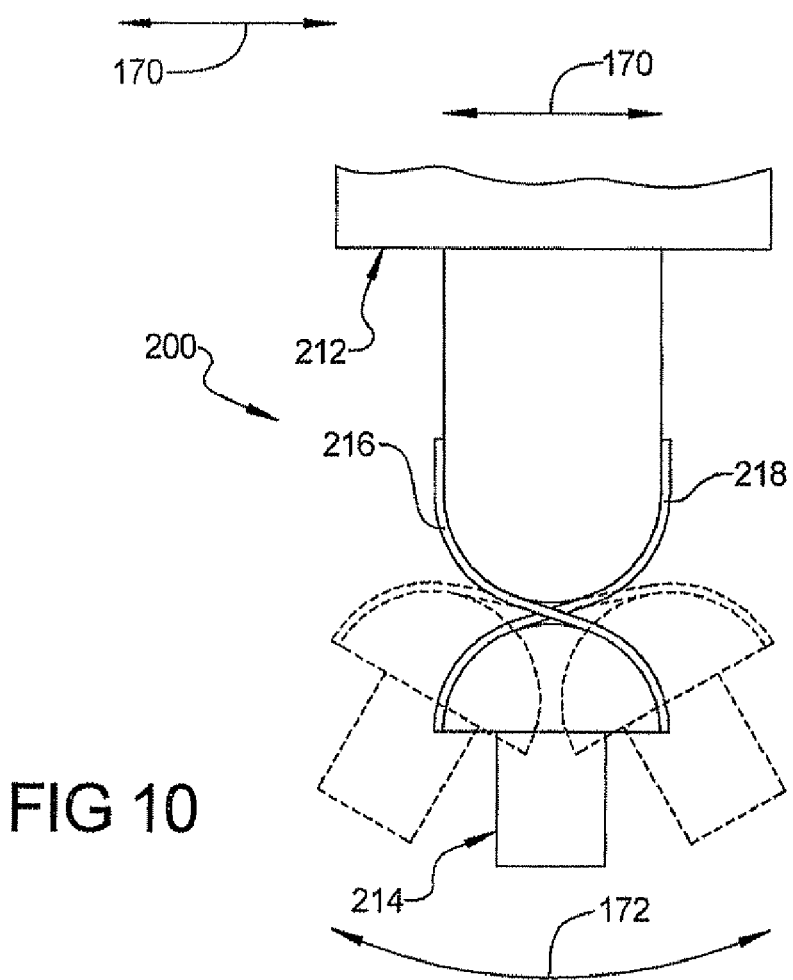
FIG. 10 is another alternative embodiment of the apparatus of FIG. 1 in which a reaction component is suspended by a plurality of flexures from the base, and free to swing about an arc in response to lateral vibrational forces experienced by the base.

FIG. 10 illustrates an apparatus 200 in accordance with yet another embodiment of the present disclosure. The apparatus 200 is identical in construction to apparatus 100 of FIG. 9, and components in common with those described in connection with FIG. 9 are increased by 100 over the numbers used in FIG. 9. However, with the apparatus 200, a reaction component 214 is suspended from a base 212. Lateral vibration energy in accordance with directional arrow 170 causes a swinging motion of the reaction component 214 in accordance with arc 172. Flexures 216 and 218 each generate electrical signals with each swinging motion of the reaction component 214, regardless of the direction in which the component 214 is moving, as the flexures 216 and 218 experience changing levels of stress and/or strain during flexing movement. The biasing force provided by flexures 216 and 218 operates to return the reaction component 214 to its initial (i.e., neutral) position, shown in solid lines in FIG. 10, once the vibration energy ceases.

Figure 11:
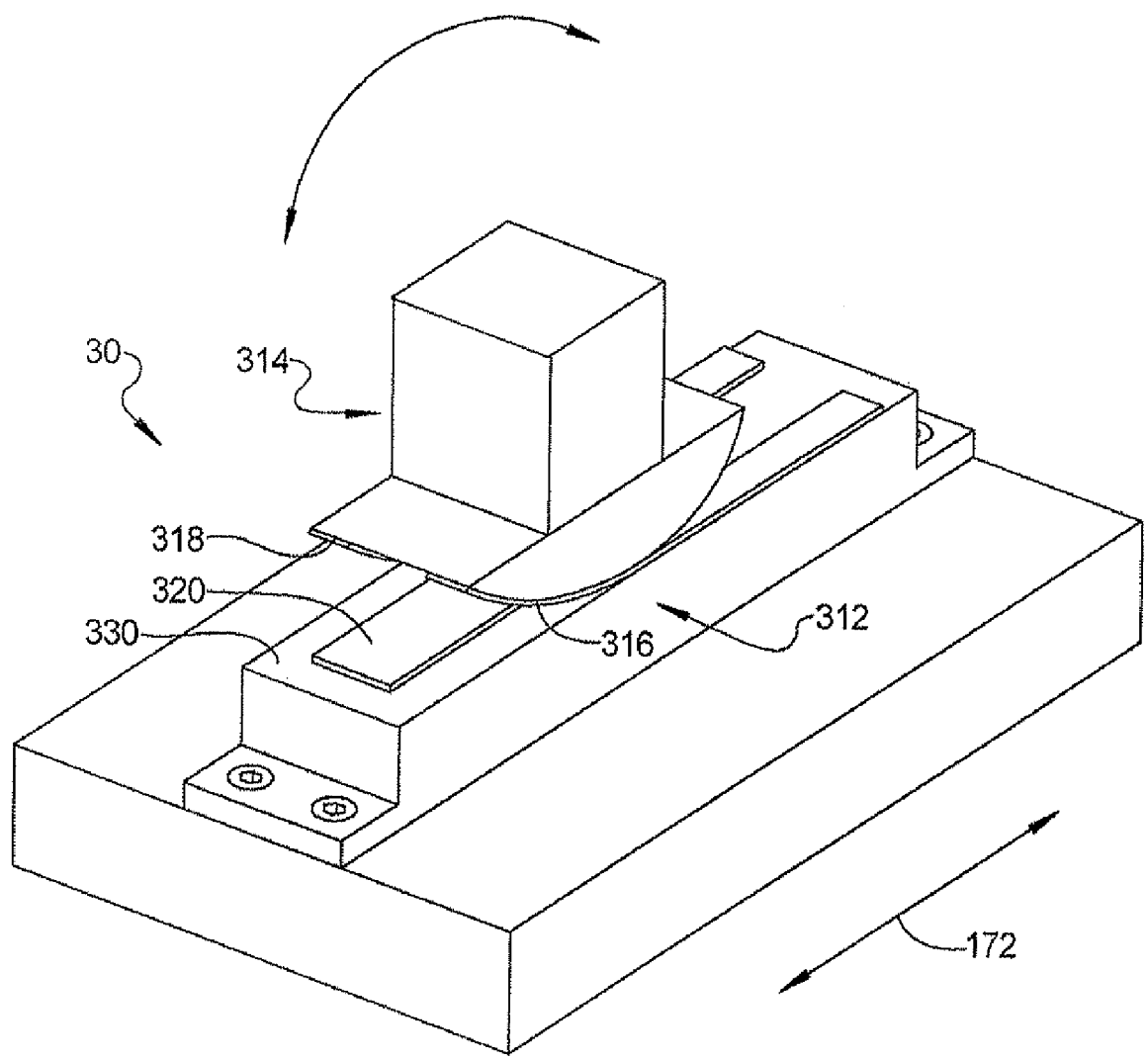
FIG. 11 is another embodiment of the apparatus in which a base having a flat upper surface is incorporated, and the reaction component is free to roll along the linear path defined by the flat upper surface of the base.

Referring to FIG. 11, still another embodiment 300 of the present disclosure is illustrated. Components in common with those of the apparatus 10 are designated with reference numerals increased by 200 over those used to describe apparatus 10. The apparatus 300 includes a reaction component 314 that is supported on a base 312. Flexures 316, 318 and 320 are used to secure the reaction component 314 to the base 312 in a manner identical to that described in connection with apparatus 10. The principal difference is that the base 312 includes a flat upper surface 330, rather than the curved upper surface 30 of base 12. As such, the reaction component 314 rolls along a flat, planar surface as it experiences a lateral vibration force in accordance with directional arrow 172. The operation of the flexures 316, 318 and 320 are otherwise identical to that described for flexures 16, 18 and 20.

The various embodiments described herein all provide for an energy harvesting apparatus and method that enables a wide frequency band of vibration energy to be harvested to power various forms of external device or to perform other useful functions. A particular advantage of the embodiments described herein is that each of the embodiments are sensitive to low amplitude vibration energy as a result of the constant moment supporting arrangement provided by the flexures described herein. The use of flexures having segmented piezoelectric material electrodes improves even further the efficiency of the apparatus 10 in generating electrical signals from small amplitude vibration energy. The various embodiments described herein may be responsive to vibration energy having a frequency as low as 2.5 Hz-20 Hz, or possibly even lower. Usable electrical power may be produced from vibration energy having as little as 0.01 G rms acceleration, or possibly even lower amounts of vibration energy. The various embodiments of the present disclosure are especially well suited to aircraft, aerospace and automotive applications where remote sensors and actuators need to be used, but where routing power supply lines to the sensor or actuator would be difficult or impossible, as well as costly.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An energy harvesting apparatus comprising:
a base;
a reaction component;
a flexure being secured at one portion thereof to said base and at a different portion to said reaction component;
said flexure further being flexible and being caused to flex in response to motion of said reaction component, in response to movement of said base; and
said flexing of said flexure enabling said flexure to generate electrical signals.

2. The apparatus of claim 1, wherein said flexure comprises a piezoelectric material.

3. The apparatus of claim 1, wherein said flexure comprises a piezoelectric material layer having a plurality of independent piezoelectric electrode segments disposed adjacent one another on a support substrate.

4. The apparatus of claim 2, wherein said piezoelectric material comprises a unimorph piezoelectric material.

5. The apparatus of claim 1, wherein said flexure comprises a magnetostrictive material.

6. The apparatus of claim 1, wherein said flexure comprises at least a pair of said flexures secured to said reaction component and to said base so as to bias and hold said reaction component in a neutral position.

7. The apparatus of claim 1, wherein:
said base includes a curved surface; and
wherein said reaction component includes a curved surface;
wherein a pair of said flexures are used to support said reaction component adjacent said curved surface of said base, with each of said flexures having opposing end portions secured to said reaction component and said base component, and such that motion of said base causes said reaction component to roll about an arc defined by said curved surface of said base.

8. The apparatus of claim 1, further comprising three flexures each being secured at opposite ends thereof to said base and said reaction component, for flexing and generating electrical signals in response to motion of said reaction component.

9. The apparatus of claim 1, wherein said reaction component has a curved surface and said base has a flat surface, said reaction component rolling about its said curved surface along said flat surface in response to vibration energy experienced by said base.

10. An energy harvesting apparatus comprising:
a base;
a reaction component;
a plurality of flexures each being secured adjacent a first end portion to said base and adjacent a second end portion thereof to said reaction component, such that said reaction component is biased into a predetermined position relative to, and adjacent to, said base; and
said flexures further being flexible in response to motion of said reaction component, in response to movement of said base, to generate electrical signals.

11. The apparatus of claim 10 wherein at least one of said flexures comprises a piezoelectric material.

12. The apparatus of claim 11, wherein said at least one flexure comprises a plurality of independent, conductive electrode segments supported on a piezoelectric material layer, and wherein said piezoelectric material layer is supported on a support substrate.

13. The apparatus of claim 11, wherein said at least one flexure comprises a unimorph piezoelectric flexure.

14. The apparatus of claim 10, wherein said at least one flexure is held under tension when biased into said predetermined position.

15. The apparatus of claim 10, wherein at least a pair of said flexures each include piezoelectric material layers that are held under tension when said reaction component is in said predetermined position.

16. The apparatus of claim 10, wherein each said flexure includes a support substrate and a piezoelectric layer secured to said support substrate.

17. The apparatus of claim 10, wherein said reaction component includes a curved surface and rolls along a path defined by a surface of said base, in response to vibration experienced by said base.

18. The apparatus of claim 17, wherein said surface of said base forms an arc.

19. The apparatus of claim 10, wherein said reaction component is suspended by said flexure components from said base.

20. A method for harvesting vibration energy from a vibrating structure, the method comprising:
using a flexure secured at a first portion to a member experiencing a vibration;
securing a second portion of said flexure to a reaction component; and
using said flexure component to generate electrical signals in response to flexing movement thereof caused by motion of said reaction component, relative to said member, as said member experiences vibration.

* * * * *